United States Patent [19]

Hubbs

[11] Patent Number: 4,745,303

[45] Date of Patent: May 17, 1988

[54] DC-DC IMPEDANCE TRANSFORMER CHARGE PUMP

[75] Inventor: John C. Hubbs, Santa Clara County, Calif.

[73] Assignee: Wavetek Corporation, San Diego, Calif.

[21] Appl. No.: 15,477

[22] Filed: Feb. 17, 1987

Related U.S. Application Data

[63] Continuation-in-part of Ser. No. 762,254, Aug. 5, 1985, abandoned.

[51] Int. Cl.$^4$ .............................................. G11C 27/02
[52] U.S. Cl. ..................................... 307/353; 307/320; 328/151
[58] Field of Search ...................... 307/352, 353, 320; 328/151

[56] References Cited

U.S. PATENT DOCUMENTS

| | | | |
|---|---|---|---|
| 3,325,654 | 6/1967 | Mrazek | 307/320 |
| 3,659,117 | 4/1972 | Caveney et al. | 307/353 |
| 3,753,132 | 8/1973 | Hill | 307/353 |

Primary Examiner—John Zazworsky
Attorney, Agent, or Firm—Flehr, Hohbach, Test, Albritton & Herbert

[57] ABSTRACT

A circuit is disclosed that includes a pair of varactors coupled to an input sample circuit and having an appropriate capacitance during the sample strobe of the input to minimize sampling errors. The varactors are combined with a control switch having an output timed to symmetrically reduce the capacitance to a new value, preferably a value approaching the input capacitance of a field effect transistor which is included in the output circuit. In this way, a noise-free voltage and power gain of CT0/CT1 can be reached, where CT0 is the initial value of the capacitance of the sampling circuit and CT1 is the final value of the capacitance of the sampling circuit.

14 Claims, 2 Drawing Sheets

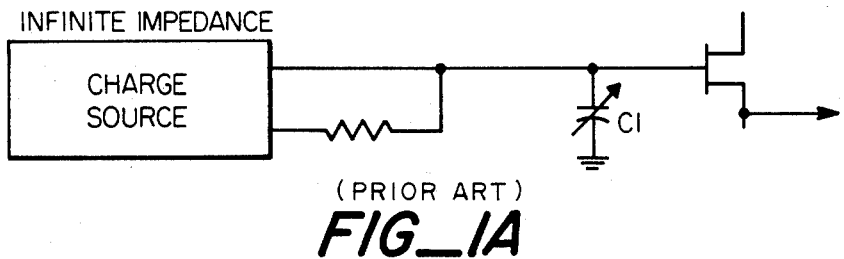
(PRIOR ART)
FIG_1A
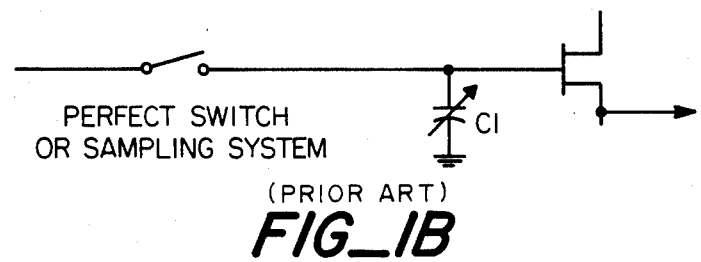
(PRIOR ART)
FIG_1B
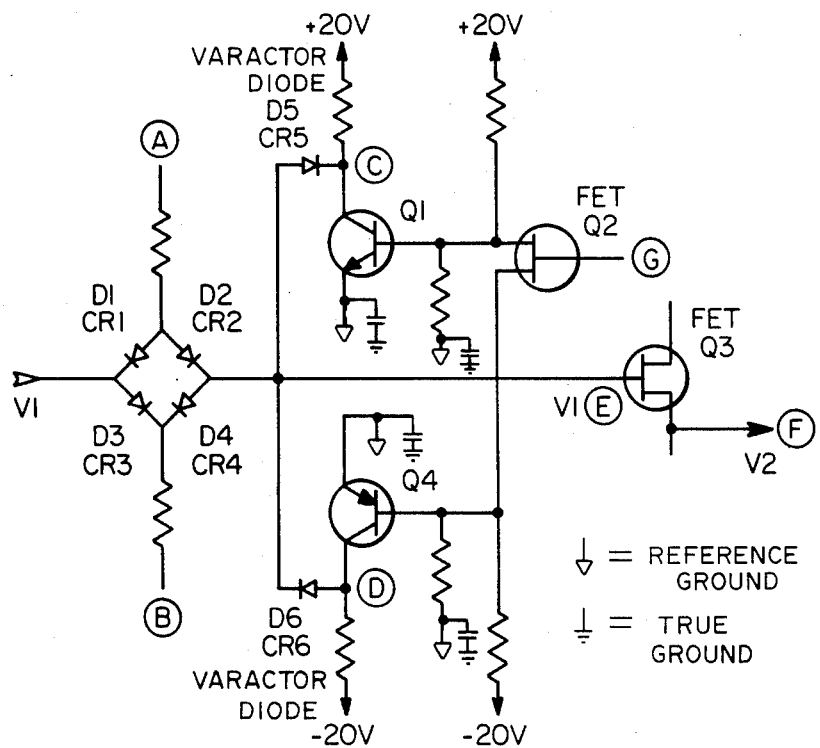
FIG_2

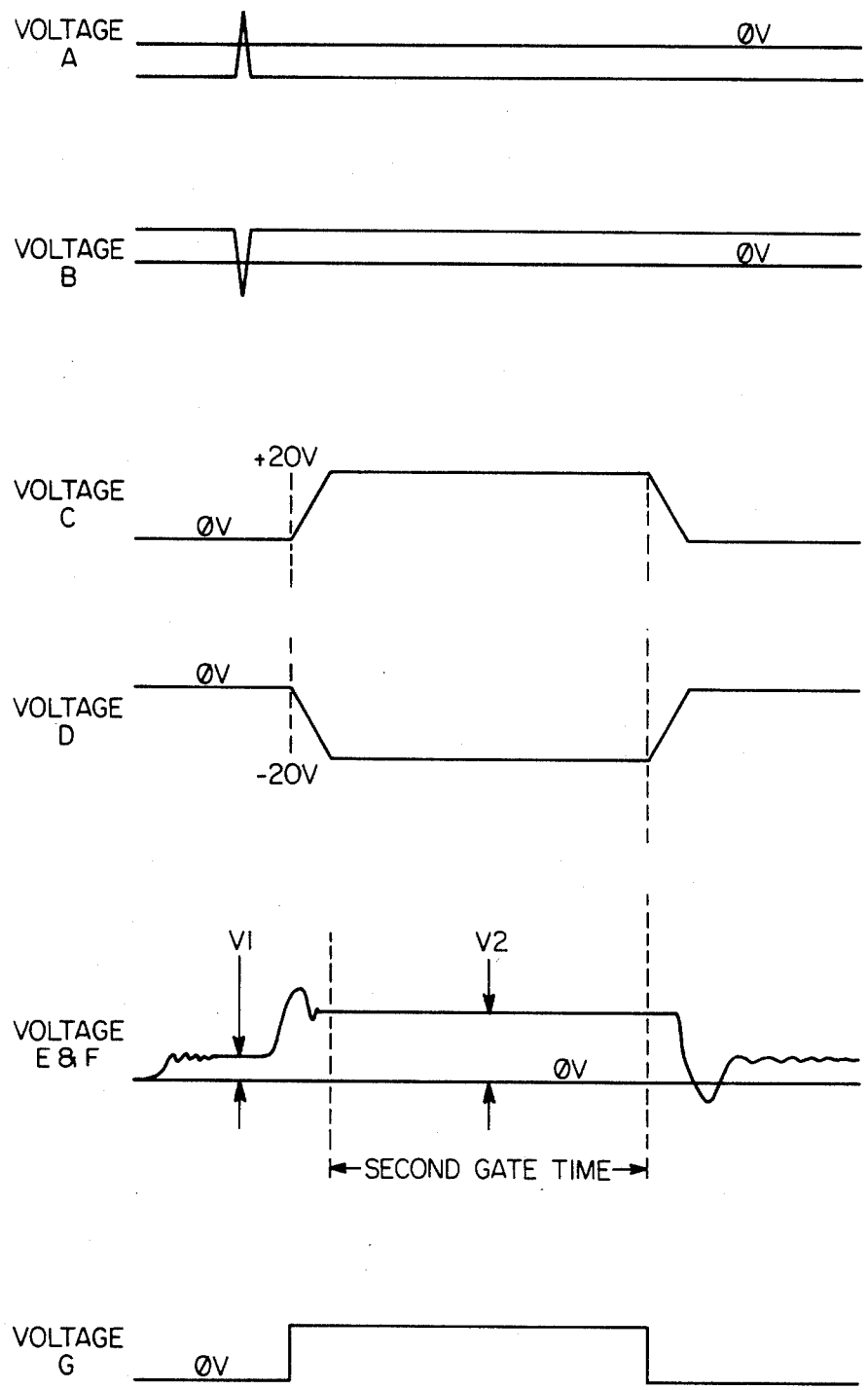
FIG_3

DC-DC IMPEDANCE TRANSFORMER CHARGE PUMP

This application is a continuation-in-part of U.S. application Ser. No. 762,254 filed Aug. 5, 1985, now abandoned.

This invention relates generally to a circuit for sampling a rapidly varying voltage and holding the sample voltage for a period of time, and more particularly to such a circuit which provides improved voltage and power gain with low noise.

It is an objective of this invention to provide an improved sampling circuit. It is a further objective of this invention to provide amplification of the portion of the input signal that is being sampled.

Yet another objective is to provide a highly sensitive, low noise signal sampling environment.

In a data acquisition system where the data to be acquired comes from an infinite impedance source as shown in FIG. 1A, or a perfect switch or sampling system as in FIG. 1B, charge sensitivity and charge noise will ultimately be limited by the input capacitance and noise of the measurement system. This measurement system is shown in FIGS. 1A and 1B as a single FET buffer or impedance converter, wherein the optimum value of capacitor $C_1$ is zero.

For imperfect switches or sampling systems, or for charge sources with less than infinite source impedance, however, it is often desirable and sometimes necessary to store the transferred charge in a capacitor $C_1$ whose value is considerably larger than that of the measurement system. In particular, in existing sampling oscilloscopes made by Tektronix, HP, Autek or EH Electronics (Assignee of this application), the capacitor of the sampling circuit labelled $C_1$ is many times larger than the input capacitance of commercially available FETs which are incorporated as a part of the output circuit of the sample-and-hold circuit. For example, in order to minimize blow-by and blow-out (vernacular for imperfections in the sampler) in sampling systems using commercially available diodes, capacitor $C_1$ is typically of the order of 5 to 10 pfd, while some inexpensive commercial FETs typically have an effective input capacity of only 0.05 pfd. Thus, there is a noise or impedance mismatch of up to two decades in presently available sampling oscilloscopes.

It is an objective of this invention to reduce the noise in, and provide an accurately amplified version of, the sampled signal to the output circuit.

These and other objectives and advantages of this invention are provided in a circuit that includes a pair of varactors (voltage controlled capacitors) coupled to the input sample circuit and having an appropriate capacitance during the sample strobe of the input to minimize blow-by and blow-out of the sampling system. The voltage control capacitors are combined with a control switch having an output timed to symmetrically reduce the capacitance to a new value, preferably a value approaching the input capacitance of the field effect transistor which is included in the output circuit. In this way, since net charge is conserved, a noise-free voltage and gain of CT0/CT1 can be achieved, where CT0 is the initial value of the total capacitance of the sampling circuit memory capacitance, and CT1 is the final total capacitance value of the voltage variable capacitance. If the strobe time is held constant for at a fixed point in time for a repetitive input waveform, the reference ground moved in the same direction as the error signal from FET Q3, and the sampling system will eventually balance to null mean error signal. The noise and accuracy of the balance so obtained will be improved by the factor CT0/CT1.

The above advantages and features of this invention will be more easily understood by reference to FIGS. 1A and 1B, which illustrate prior art approaches to the problem;

FIG. 2 which is a detailed schematic of the circuit of this invention; and

FIG. 3 which is a timing diagram of the input, output and control signals of this invention.

Referring to the schematic of FIG. 2, the input circuit which comprises a diode bridge formed of diodes D1-D4, is strobed to sample the input signal V1 during a first read period. The strobe signal voltages A, B are shown at the top of FIG. 3 and are of relatively brief duration. This relatively brief signal defines the sampling period for the incoming voltage V1 shown on the fifth line of FIG. 3. The bandwidth of the sampling system is determined to a first order by the width of the strobe pulses at points A and B. In particular, the rise time of the sample pulse will be approximately the width of the strobe pulse at the voltage point where the diodes begin and end conduction.

Most of the charge transferred from the input signal is stored in storage capacitor means comprising varactor diodes CR5, CR6; although some small amount of the charge is stored in the input capacitance of FET Q3 and stray circuit capacitances. However, at this point, since capacitances CR5, CR6 are variable, they are initially at a high capacitance state to minimize the charge lost to stray circuit capacitances.

After the completion of the bridge strobes A, B, a second signal shown as voltage G is initiated, applied to the gate of FET Q2 to turn on this FET. This FET is coupled to the bases of two bipolar transistors of opposite conductivity type, Q1 and Q4 which are appropriately biased by DC connections to reference ground and AC connections (through capacitors as shown) to true ground. These two transistors respond to the state of FET Q2 to set the capacitance value of varactor diodes CR5, CR6. Turning on this transistor Q2 removes the input current from the bases of transistors Q1 and Q4 so that they switch from a very low impedance state (circa 5Ω) to open circuit, allowing a balanced back-biasing of varactors CR5 and CR6 to occur. This reduces the capacitance of varactor diodes CR5, CR6 from a first higher value at which the sampled signal is stored to a value which preferably approaches as nearly as possible the input capacitance of FET Q3 of the output circuit.

At the end of the transition of variable capacitors CR5, CR6 (which is indicated by the dotted line which appears in FIG. 3 at voltages C, D and F), an amplified version of the strobed input voltage now appears as voltage V2 at the output F of a readout means comprising FET Q3. At the end of this amplification process, the initial voltage V1 at readout FET Q3 is amplified to an output value V2 to be read during a readout period indicated as SECOND GATE TIME in FIG. 3, and the voltage gain V2/V1 is found to be about 7, in excellent agreement with the theoretical gain derived from charge conservation and measured C(V). A typical varactor is Philips BBY31; a typical input FET used at transistor Q3 is Telmos SD211.

Since the positive-going collector voltage at transistor Q1, the negative-going collector voltage at transistor Q4, and diodes D5 and D6 are not perfectly matched, there will be "glitches" in the output voltage from transistor Q3; but these are observed to be on the order of 100 millivolts and occur only during the transition time of the variable capacitors CR5, CR6. According to test, they cease when the transistor collector Q1 arrives at +20 volts, and the collector of transistor Q4 arrives at −20 volts.

In summary, the disclosed circuit functions as a DC—DC impedance transformer or charge pump, and has been shown to have a high-speed reaction time, and provide a relatively noise-free output comprising an amplified version of the sampled input. Modifications of the disclosed preferred embodiment may occur to a person of skill in the art who studies the subject disclosure. Therefore, the scope of the present invention is to be limited only by the following claims.

What is claimed is:

1. A circuit for sampling a voltage of an input waveform signal including an input for receiving the signal, sampling means connected to said input for periodically sampling the signal,
   storage capacitor means for storing a voltage corresponding to the sampled portion of the signal, said storage capacitor means comprising at least a first voltage variable capacitor having first and second capacitance values,
   control means for setting said first capacitor to a first upper value during a sampling period of said sampling means for storing said voltage, and for setting the capacitance of said capacitor to a second lower value during a read period of said sample circuit, and
   output means coupled to said capacitor for providing an amplified version of said input signal.

2. A circuit as in claim 1 wherein said storage capacitor means comprises said first and a second voltage variable capacitor connected to the input and said control means comprises means for symmetrically controlling the voltage across the capacitors for setting the capacitance thereof at one of said capacitance values.

3. A circuit as in claim 2 wherein said means for symmetrically controlling the voltage comprises a pair of oppositely biased complementary-type transistors coupled to said capacitors, and a control switch coupled to control nodes of said transistors for switching said transistors and thereby the capacitance of said voltage variable capacitors between said first and second capacitance values.

4. A circuit as in claim 3 wherein said output means comprises an FET having an input capacitance, the second value of said capacitance of said storage capacitor means being near to said output means FET's input capacitance.

5. A circuit as in claim 3 wherein said control switch comprises an FET coupled to the control nodes of said two complementary transistors and responsive to the input signal to alter the capacitance of the capacitor means from the first upper value to the second lower value.

6. A circuit as in claim 4 wherein said sampling means comprise a diode bridge connected between the signal input and the FET of the output means, and control means for periodically strobing the bridge to sample the input signal.

7. A circuit for sampling a voltage of an input waveform signal including an input for receiving the signal, means connected to said input for periodically sampling the signal,
   storage capacitor means connected to the input for storing a voltage corresponding to the sampled portion of the signal, said storage capacitor means comprising at least a first voltage variable capacitor having first and second capacitance values,
   control means for setting said first capacitor to a first upper value during a sampling period of said sampling means, and for periodically resetting said first capacitor to a second lower value during a read period of said sampling circuit, switch means for setting said capacitance means to said first and second values in timed relationship to said periodic sampling, and
   output means coupled to said capacitor for providing an amplified version of said input signal.

8. A circuit as in claim 7 wherein said storage capacitor means comprises said first and a second voltage variable capacitor connected to the input and said control means comprises means for symmetrically increasing the voltage across the capacitors for setting the capacitance thereof to said second value.

9. A circuit as in claim 8 wherein said means for symmetrically controlling the voltage comprise a pair of oppositely biased complementary-type transistors coupled to said capacitors, and said switch means comprises a control switch coupled to control nodes of said transistors for switching the state of said transistors and thereby the capacitance of said voltage variable capacitors between said first and second capacitance values.

10. A circuit as in claim 9 wherein said output means comprises an FET having an input capacitance, the second value of said capacitance being near to said output means FET's input capacitance.

11. A circuit as in claim 9 wherein said control switch comprises an FET coupled between the control nodes of said two complementary transistors.

12. A circuit as in claim 11 wherein said sampling means comprises a diode bridge connected between the signal input and the FET of the output means, and control means for periodically strobing the bridge to sample the input signal.

13. A method of sampling an input voltage waveform and forwarding an amplified version thereof comprising
   strobing an input diode bridge to sample the incoming signal,
   coupling said signal sample through a variable capacitance to an output circuit comprising an FET having a known input capacitance, said coupling step comprising
   setting said variable capacitance to a first upper level during said sampling period, and periodically setting said variable capacitance to a second lower level during a read period of the sample circuit to provide an amplified representation of said waveform signal sample.

14. A method as in claim 13 wherein said variable capacitance comprises a pair of voltage variable capacitors controlled by a transistorized switch, said setting step comprising symmetrically simultaneously modifying the capacitance of said pair after said sampling strobe step.

* * * * *